US012035097B2

(12) United States Patent
Kulavik et al.

(10) Patent No.: US 12,035,097 B2
(45) Date of Patent: *Jul. 9, 2024

(54) ELECTRONIC HEADSET ACCESSORY

(71) Applicant: Voyetra Turtle Beach, Inc., Valhalla, NY (US)

(72) Inventors: Richard Kulavik, San Jose, CA (US); Michael A. Jessup, San Leandro, CA (US); Travis Kettering, San Mateo, CA (US)

(73) Assignee: Voyetra Turtle Beach, Inc., White Plains, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/792,621

(22) Filed: Feb. 17, 2020

(65) Prior Publication Data

US 2020/0186913 A1 Jun. 11, 2020

Related U.S. Application Data

(63) Continuation of application No. 14/263,210, filed on Apr. 28, 2014, now Pat. No. 10,567,865.
(Continued)

(51) Int. Cl.
*H04R 1/10* (2006.01)
*G10L 15/00* (2013.01)
(Continued)

(52) U.S. Cl.
CPC ......... *H04R 1/1091* (2013.01); *H04R 1/1041* (2013.01); *G10L 15/00* (2013.01);
(Continued)

(58) Field of Classification Search
CPC .. H04R 1/1091; H04R 1/1041; H04R 1/1008; H04R 2201/107; H04R 2499/10;
(Continued)

(56) References Cited

U.S. PATENT DOCUMENTS 4,779,746 A 10/1988 Usner
4,879,746 A 11/1989 Young
(Continued)

FOREIGN PATENT DOCUMENTS

WO WO-2007126390 A1 * 11/2007 ........... H04R 29/008
WO 2013152453 10/2013

*Primary Examiner* — Carolyn R Edwards
*Assistant Examiner* — Kuassi A Ganmavo
(74) *Attorney, Agent, or Firm* — McAndrews, Held & Malloy, Ltd.

(57) ABSTRACT

A headset accessory comprises circuitry and is configured to mechanically attach to an audio headset. The circuitry of the headset may be operable to establish a link to the audio headset that supports conveyance of bias voltage, bias current, and/or information between the circuitry of the accessory and circuitry of the audio headset. The headset accessory may be configured to attach to a housing of the headset on a surface of the housing opposite an ear cup. A state of the circuitry of the accessory may be controlled based on the information received from the audio headset via the link. The information may include characteristics of audio being processed by the audio headset. The circuitry of the headset accessory may comprise non-volatile memory, and the non-volatile memory may store parameter settings for configuring audio processing circuitry of the audio headset.

20 Claims, 11 Drawing Sheets

Related U.S. Application Data

(60) Provisional application No. 61/891,620, filed on Oct. 16, 2013.

(51) Int. Cl.
*H03G 3/34* (2006.01)
*H04S 1/00* (2006.01)
*H04S 7/00* (2006.01)

(52) U.S. Cl.
CPC .......... *H03G 3/341* (2013.01); *H04R 1/1008* (2013.01); *H04R 2201/107* (2013.01); *H04R 2499/10* (2013.01); *H04S 1/005* (2013.01); *H04S 7/306* (2013.01)

(58) Field of Classification Search
CPC ....... G10L 15/00; G10L 13/033; H03G 3/341; H04S 1/005; H04S 7/306; A63F 13/79; G06F 17/3227
See application file for complete search history.

(56) References Cited

U.S. PATENT DOCUMENTS

| | | | |
|---|---|---|---|
| 5,774,791 A * | 6/1998 | Strohallen | H04B 5/02 |
| | | | 455/92 |
| 6,069,964 A | 5/2000 | Yang | |
| 6,466,681 B1 | 10/2002 | Siska, Jr. et al. | |
| 6,888,950 B2 | 5/2005 | Siskin | |
| 7,878,863 B2 | 2/2011 | Johansson | |
| 8,139,807 B2 | 3/2012 | Reiss et al. | |
| 8,199,942 B2 | 6/2012 | Mao | |
| 8,213,666 B2 * | 7/2012 | Groesch | H04R 5/033 |
| | | | 381/376 |
| 8,335,335 B2 | 12/2012 | Reiss et al. | |
| 8,498,426 B2 | 7/2013 | Bonanno | |
| 2001/0053228 A1 | 12/2001 | Jones | |
| 2003/0060242 A1 | 3/2003 | Dotzler | |
| 2003/0216178 A1 * | 11/2003 | Danieli | A63F 13/87 |
| | | | 463/35 |
| 2004/0224638 A1 | 11/2004 | Fadell | |
| 2005/0170889 A1 * | 8/2005 | Lum | A63F 13/235 |
| | | | 463/39 |
| 2006/0062417 A1 | 3/2006 | Tachikawa | |
| 2006/0210092 A1 * | 9/2006 | Navid | H04R 1/10 |
| | | | 381/384 |
| 2007/0064969 A1 | 3/2007 | Chou | |
| 2007/0291974 A1 | 12/2007 | Eisenbraun | |
| 2007/0299723 A1 * | 12/2007 | Willis | G06Q 30/0277 |
| | | | 705/14.73 |
| 2008/0181419 A1 * | 7/2008 | Goldstein | H04R 1/1016 |
| | | | 381/57 |
| 2008/0220831 A1 * | 9/2008 | Alameh | H04M 1/6066 |
| | | | 455/575.2 |
| 2008/0268960 A1 | 10/2008 | Farrier | |
| 2009/0048070 A1 * | 2/2009 | Vincent | A63B 24/0084 |
| | | | 482/8 |
| 2009/0302806 A1 | 12/2009 | Lindlar | |
| 2010/0046781 A1 | 2/2010 | Chen | |
| 2010/0054493 A1 | 3/2010 | Lin | |
| 2010/0120533 A1 * | 5/2010 | Bracken | A63F 13/12 |
| | | | 463/35 |
| 2010/0131691 A1 | 5/2010 | Chatterjee | |
| 2011/0018356 A1 | 1/2011 | Chatterjee | |
| 2011/0164776 A1 * | 7/2011 | Kelly | H04R 1/1016 |
| | | | 381/379 |
| 2011/0167176 A1 * | 7/2011 | Yew | G06F 13/4247 |
| | | | 710/6 |
| 2011/0235807 A1 | 9/2011 | Hayashi | |
| 2012/0007562 A1 * | 1/2012 | Yang | H02M 3/158 |
| | | | 320/128 |
| 2012/0014553 A1 * | 1/2012 | Bonanno | G10L 15/00 |
| | | | 381/364 |
| 2012/0052948 A1 | 3/2012 | Soelberg | |
| 2012/0283015 A1 | 11/2012 | Bonanno | |
| 2012/0328119 A1 * | 12/2012 | Heise | H04R 1/1066 |
| | | | 381/74 |
| 2013/0003984 A1 | 1/2013 | Belafonte | |
| 2013/0108091 A1 | 5/2013 | Stoffaneller | |
| 2013/0223631 A1 | 8/2013 | Greuet | |
| 2013/0237146 A1 | 9/2013 | Serota | |
| 2014/0036127 A1 * | 2/2014 | Pong | H04R 1/1008 |
| | | | 348/333.01 |
| 2014/0073429 A1 * | 3/2014 | Meneses | H04S 3/004 |
| | | | 463/35 |
| 2014/0093109 A1 | 4/2014 | Bazarjani | |
| 2014/0330559 A1 | 11/2014 | Higbie | |
| 2014/0342836 A1 * | 11/2014 | Pearce | G07F 17/32 |
| | | | 463/42 |
| 2016/0196100 A1 * | 7/2016 | Yow | H04R 1/1041 |
| | | | 381/74 |

\* cited by examiner

US 12,035,097 B2

ELECTRONIC HEADSET ACCESSORY

CLAIM OF PRIORITY

This patent application is a continuation of application Ser. No. 14/263,210 filed on Apr. 28, 2014, now U.S. Pat. No. 10,567,865, which claims priority to and the benefit of U.S. provisional patent application 61/891,620 titled "Electronic Headset Accessory" filed on Oct. 16, 2013, the entirety of which is hereby incorporated by reference.

INCORPORATION BY REFERENCE

The entirety of each of the following applications is hereby incorporated herein by reference:
- U.S. patent application Ser. No. 13/040,144 titled "Gaming Headset with Programmable Audio" and published as US2012/0014553; and
- U.S. provisional patent application 61/878,728 titled "Multi-Device Gaming Interface" filed on Sep. 17, 2013.

TECHNICAL FIELD

Aspects of the present application relate to electronic gaming. More specifically, to methods and systems for an electronic headset accessory.

BACKGROUND

Limitations and disadvantages of conventional approaches to audio processing for gaming will become apparent to one of skill in the art, through comparison of such approaches with some aspects of the present method and system set forth in the remainder of this disclosure with reference to the drawings.

BRIEF SUMMARY

Methods and systems are provided for an electronic headset accessory, substantially as illustrated by and/or described in connection with at least one of the figures, as set forth more completely in the claims.

DETAILED DESCRIPTION

As utilized herein the terms "circuits" and "circuitry" refer to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code. As utilized herein, "and/or" means any one or more of the items in the list joined by "and/or". As an example, "x and/or y" means any element of the three-element set {(x), (y), (x, y)}. As another example, "x, y, and/or z" means any element of the seven-element set {(x), (y), (z), (x, y), (x, z), (y, z), (x, y, z)}. As utilized herein, the terms "e.g.," and "for example" set off lists of one or more non-limiting examples, instances, or illustrations. As utilized herein, circuitry is "operable" to perform a function whenever the circuitry comprises the necessary hardware and code (if any is necessary) to perform the function, regardless of whether performance of the function is disabled, or not enabled, by some user-configurable setting.

Figure 1A:
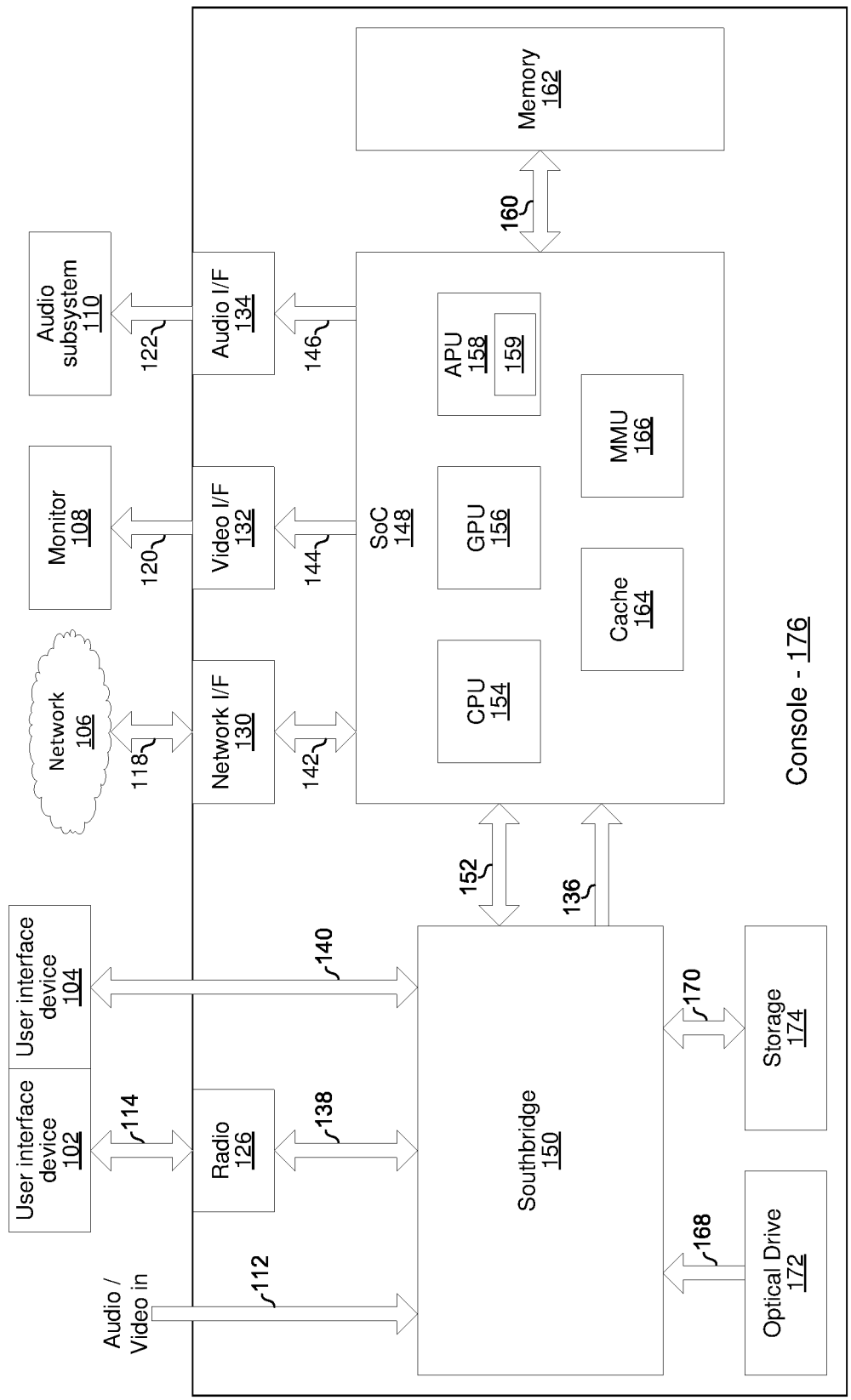
FIG. 1A depicts an example gaming console.

Referring to FIG. 1A, there is shown video game console 176 which may be, for example, a Windows computing device, a Unix computing device, a Linux computing device, an Apple OSX computing device, an Apple iOS computing device, an Android computing device, a Microsoft Xbox, a Sony Playstation, a Nintendo Wii, or the like. The example game console 176 comprises a video interface 124, radio 126, data interface 128, network interface 130, video interface 132, audio interface 134, southbridge 150, main system on chip (SoC) 148, memory 162, optical drive 172, and storage device 174. The SoC 148 comprises central processing unit (CPU) 154, graphics processing unit (GPU) 156, audio processing unit (APU) 158, cache memory 164, and memory management unit (MMU) 166. The various components of the game console 176 are communicatively coupled through various busses/links 112, 138, 140, 142, 144, 146, 152, 136, 160, 168, and 170.

The southbridge 150 comprises circuitry that supports one or more data bus protocols such as High-Definition Multimedia Interface (HDMI), Universal Serial Bus (USB), Serial Advanced Technology Attachment 2 (SATA 2), embedded multimedia card interface (e.MMC), Peripheral Component Interconnect Express (PCIe), or the like. The southbridge 150 may receive audio and/or video from an external source via link 112 (e.g., HDMI), from the optical drive (e.g., Blu-Ray) 172 via link 168 (e.g., SATA 2), and/or from storage 174 (e.g., hard drive, FLASH memory, or the like) via link 170 (e.g., SATA 2 and/or e.MMC). Digital audio and/or video is output to the SoC 148 via link 136 (e.g., CEA-861-E compliant video and IEC 61937 compliant audio). The southbridge 150 exchanges data with radio 126 via link 138 (e.g., USB), with external devices via link 140 (e.g., USB), with the storage 174 via the link 170, and with the SoC 148 via the link 152 (e.g., PCIe).

The radio 126 comprises circuitry operable to communicate in accordance with one or more wireless standards such as the IEEE 802.11 family of standards, the Bluetooth family of standards, and/or the like.

The network interface 130 may comprise circuitry operable to communicate in accordance with one or more wired standards and to convert between wired standards. For example, the network interface 130 may communicate with the SoC 148 via link 142 using a first standard (e.g., PCIe) and may communicate with the network 106 using a second standard (e.g., gigabit Ethernet).

The video interface 132 may comprise circuitry operable to communicate video in accordance with one or more wired or wireless video transmission standards. For example, the video interface 132 may receive CEA-861-E compliant video data via link 144 and encapsulate/format/etc., the video data in accordance with an HDMI standard for output to the monitor 108 via an HDMI link 120.

The audio interface 134 may comprise circuitry operable to communicate audio in accordance with one or more wired or wireless audio transmission standards. For example, the audio interface 134 may receive CEA-861-E compliant video data via link 144 and encapsulate/format/etc. the video data in accordance with an HDMI standard for output to the monitor 108 via an HDMI link 120.

The central processing unit (CPU) 154 may comprise circuitry operable to execute instructions for controlling/coordinating the overall operation of the game console 176. Such instructions may be part of an operating system of the console and/or part of one or more software applications running on the console.

The graphics processing unit (GPU) 156 may comprise circuitry operable to perform graphics processing functions such as compression, decompression, encoding, decoding, 3D rendering, and/or the like.

The audio processing unit (APU) 158 may comprise circuitry operable to perform audio processing functions such as volume/gain control, compression, decompression, encoding, decoding, surround-sound processing, and/or the like to output single channel or multi-channel (e.g., 2 channels for stereo or 6, 8 or more channels for surround sound) audio. The APU 158 comprises memory (e.g., volatile and/or non-volatile memory) 159 which stores parameter settings affect processing of audio by the APU 158. For example, the parameter settings may include a first audio gain/volume setting that determines, at least in part, a volume of game audio output by the console 176 and a second audio gain/volume setting that determines, at least in part, a volume of chat audio output by the console 176. The parameter settings may be modified via a graphical user interface (GUI) of the console and/or via an application programming interface (API) provided by the console 176.

The cache memory 164 comprises high-speed memory (typically DRAM) for use by the CPU 154, GPU 156, and/or APU 158. The memory 162 may comprise additional memory for use by the CPU 154, GPU 156, and/or APU 158. The memory 162, typically DRAM, may operate at a slower speed than the cache memory 164 but may also be less expensive than cache memory as well as operate at a higher-speed than the memory of the storage device 174. The MMU 166 controls accesses by the CPU 154, GPU 156, and/or APU 158 to the memory 162, the cache 164, and/or the storage device 174.

In FIG. 1A, the example game console 176 is communicatively coupled to a user interface device 102, a user interface device 104, a network 106, a monitor 108, and audio subsystem 110.

Each of the user interface devices 102 and 104 may comprise, for example, a game controller, a keyboard, a motion sensor/position tracker, or the like. The user interface device 102 communicates with the game console 176 wirelessly via link 114 (e.g., Wi-Fi Direct, Bluetooth, and/or the like). The user interface device 102 communicates with the game console 176 via the wired link 140 (e.g., USB or the like).

The network 160 comprises a local area network and/or a wide area network. The game console 176 communicates with the network 106 via wired link 118 (e.g., Gigabit Ethernet).

The monitor 108 may be, for example, a LCD, OLED, or PLASMA screen. The game console 176 sends video to the monitor 108 via link 120 (e.g., HDMI).

The audio subsystem 110 may be, for example, a headset, a combination of headset and audio basestation, or a set of speakers and accompanying audio processing circuitry. The game console 176 sends audio to the subsystem 110 via link(s) 122 (e.g., S/PDIF for digital audio or "line out" for analog audio). Additional details of an example audio subsystem 110 are described below.

Figure 1B:
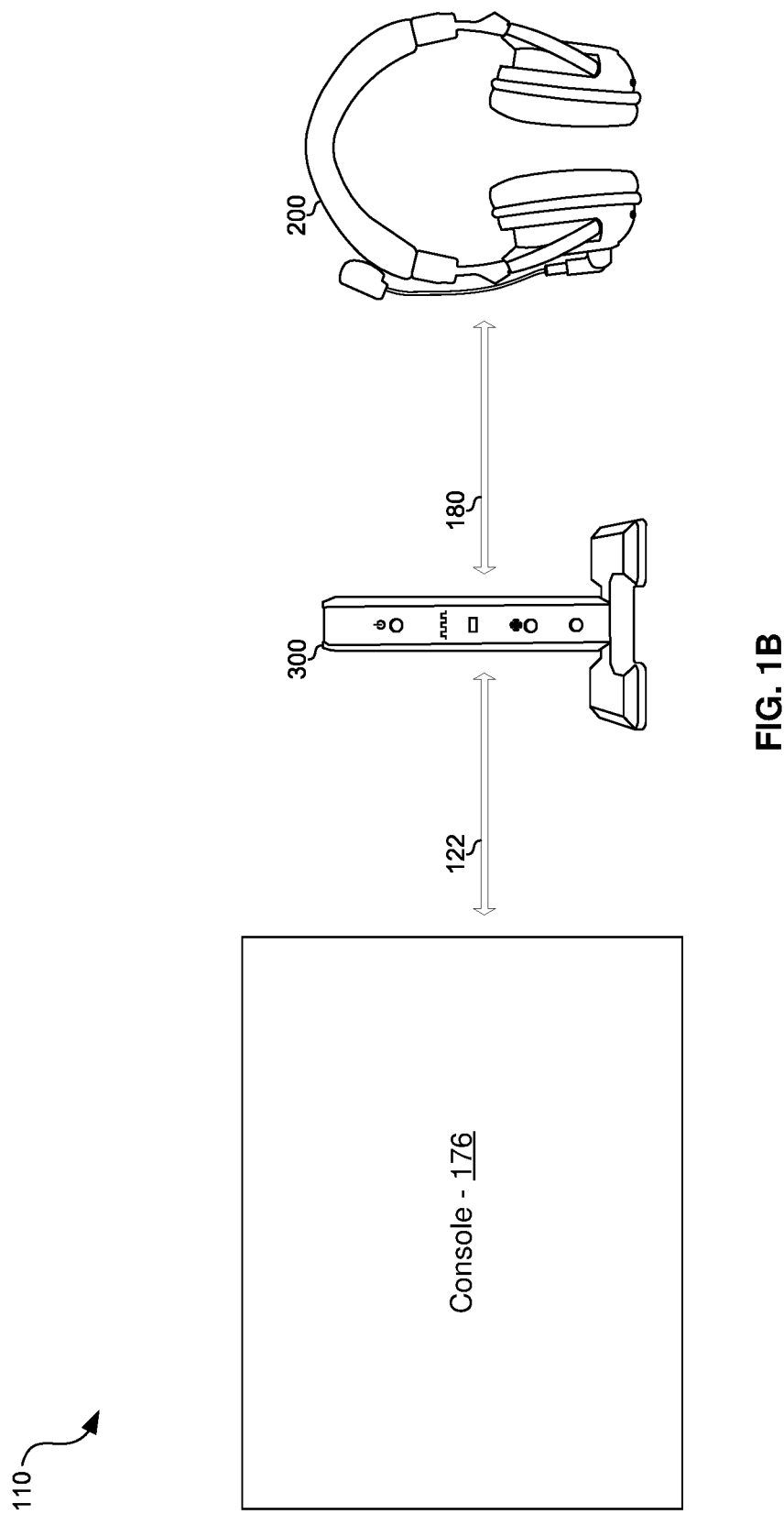
FIG. 1B depicts an example gaming audio subsystem comprising a headset and an audio basestation.

FIG. 1B depicts an example gaming audio subsystem comprising a headset and an audio basestation. Shown is a headset 200 and an audio basestation 300. The headset 200 communicates with the basestation 300 via a link 180 and the basestation 300 communicates with the console 176 via a link 122. The link 122 may be as described above. In an example implementation, the link 180 may be a proprietary wireless link operating in an unlicensed frequency band. The headset 200 may be as described below with reference to FIGS. 2A-2D. The basestation 300 may be as described below with reference to FIGS. 3A-3B.

Figure 1C:
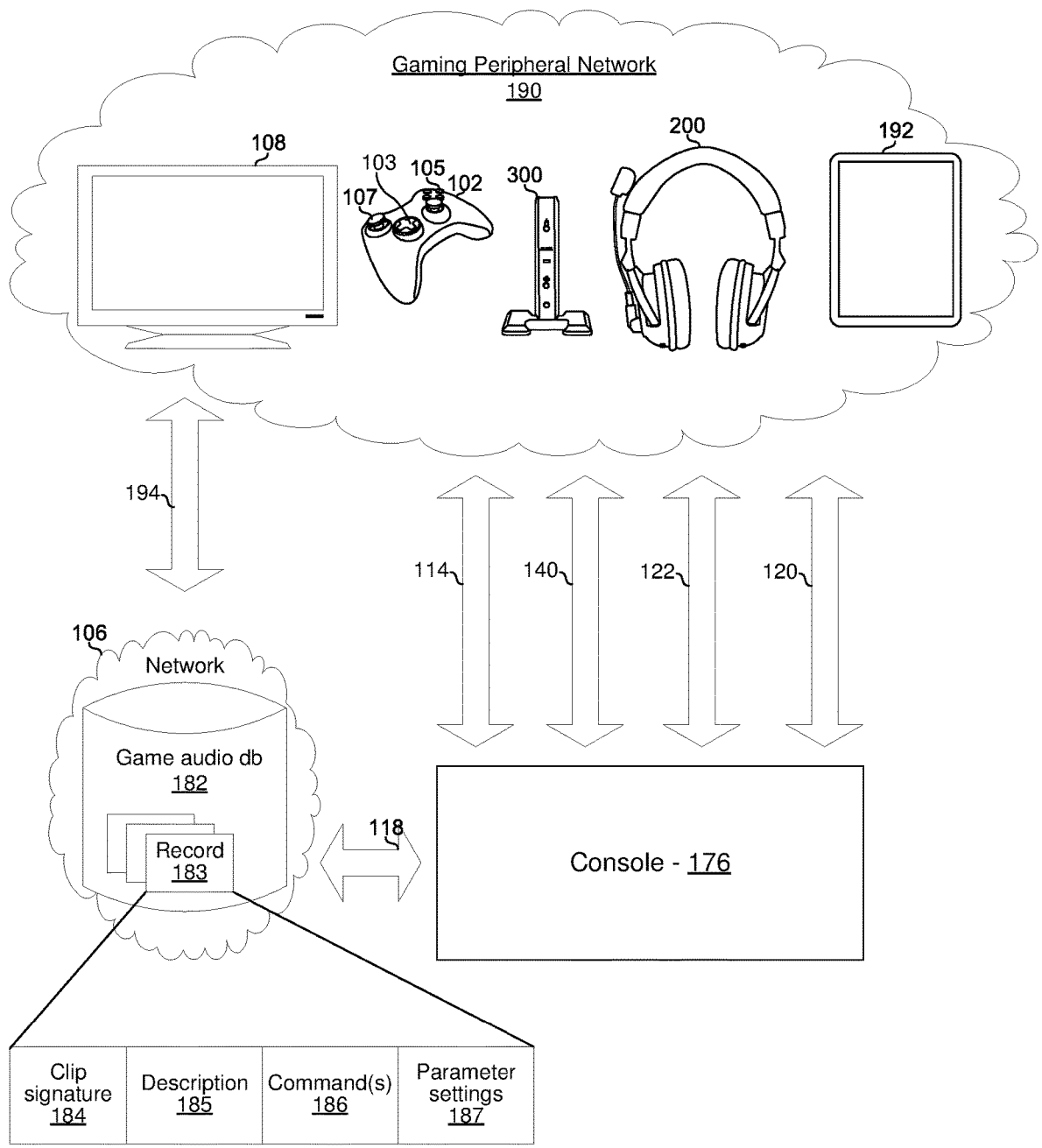
FIG. 1C depicts the example gaming console and an associated network of peripheral devices.

Referring to FIG. 1C, again shown is the console 176 connected to a plurality of peripheral devices and a network 106. The example peripheral devices shown include a monitor 108, a user interface device 102, a headset 200, an audio basestation 300, and a multi-purpose device 192.

The monitor 108 and user interface device 102 are as described above. An example implementation of the headset 200 is described below with reference to FIGS. 2A-2D. An example implementation of the audio basestation is described below with reference to FIGS. 3A-3B.

The multi-purpose device 192 may be, for example, a tablet computer, a smartphone, a laptop computer, or the like and that runs an operating system such as Android, Linux, Windows, iOS, OSX, or the like. An example implementation of the multi-purpose device 192 is described below with reference to FIG. 4. Hardware (e.g., a network adaptor) and software (i.e., the operating system and one or more applications loaded onto the device 192) may configure the device 192 for operating as part of the GPN 190. For example, an application running on the device 192 may cause display of a graphical user interface via which a user can access gaming-related data, commands, functions, parameter settings, etc. and via which the user can interact with the console 176 and the other devices of the GPN 190 to enhance his/her gaming experience. Examples of such interactions between the device 192 and the other devices of the GPN 190 are described in above incorporated U.S. patent application Ser. No. 61/878,728 titled "Multi-Device Gaming Interface.

The peripheral devices 102, 108, 192, 200, 300 are in communication with one another via a plurality of wired and/or wireless links (represented visually by the placement of the devices in the cloud of GPN 190). Each of the peripheral devices in the gaming peripheral network (GPN) 190 may communicate with one or more others of the peripheral devices in the GPN 190 in a single-hop or multi-hop fashion. For example, the headset 200 may communicate with the basestation 300 in a single hop (e.g., over a proprietary RF link) and with the device 192 in a single hop (e.g., over a Bluetooth or Wi-Fi direct link), while the tablet may communicate with the basestation 300 in two hops via the headset 200. As another example, the user interface device 102 may communicate with the headset 200 in a single hop (e.g., over a Bluetooth or Wi-Fi direct link) and with the device 192 in a single hop (e.g., over a Bluetooth or Wi-Fi direct link), while the device 192 may communicate with the headset 200 in two hops via the user interface device 102. These example interconnections among the peripheral devices of the GPN 190 are merely examples, any number and/or types of links among the devices of the GPN 190 is possible.

The GPN 190 may communicate with the console 176 via any one or more of the links 114, 140, 122, and 120 described above. The GPN 190 may communicate with a network 106 via one or more links 194 each of which may be, for example, Wi-Fi, wired Ethernet, and/or the like.

A database 182 which stores gaming audio data is accessible via the network 106. The gaming audio data may comprise, for example, signatures (or acoustic fingerprints) of particular audio clips (e.g., individual sounds or collections or sequences of sounds) that are part of the game audio of particular games, of particular levels/scenarios of particular games, particular characters of particular games, etc. In an example implementation, the database 182 may comprise a plurality of records 183, where each record 183 comprises an audio clip (or signature of the clip) 184, a description of the clip 184 (e.g., the game it is from, when it occurs in the game, etc.), one or more gaming commands 186 associated with the clip, one or more parameter settings 187 associated with the clip, and/or other data associated with the audio clip. Records 183 of the database 182 may be downloadable to, or accessed in real-time by, one of more devices of the GPN 190.

Figure 2A:
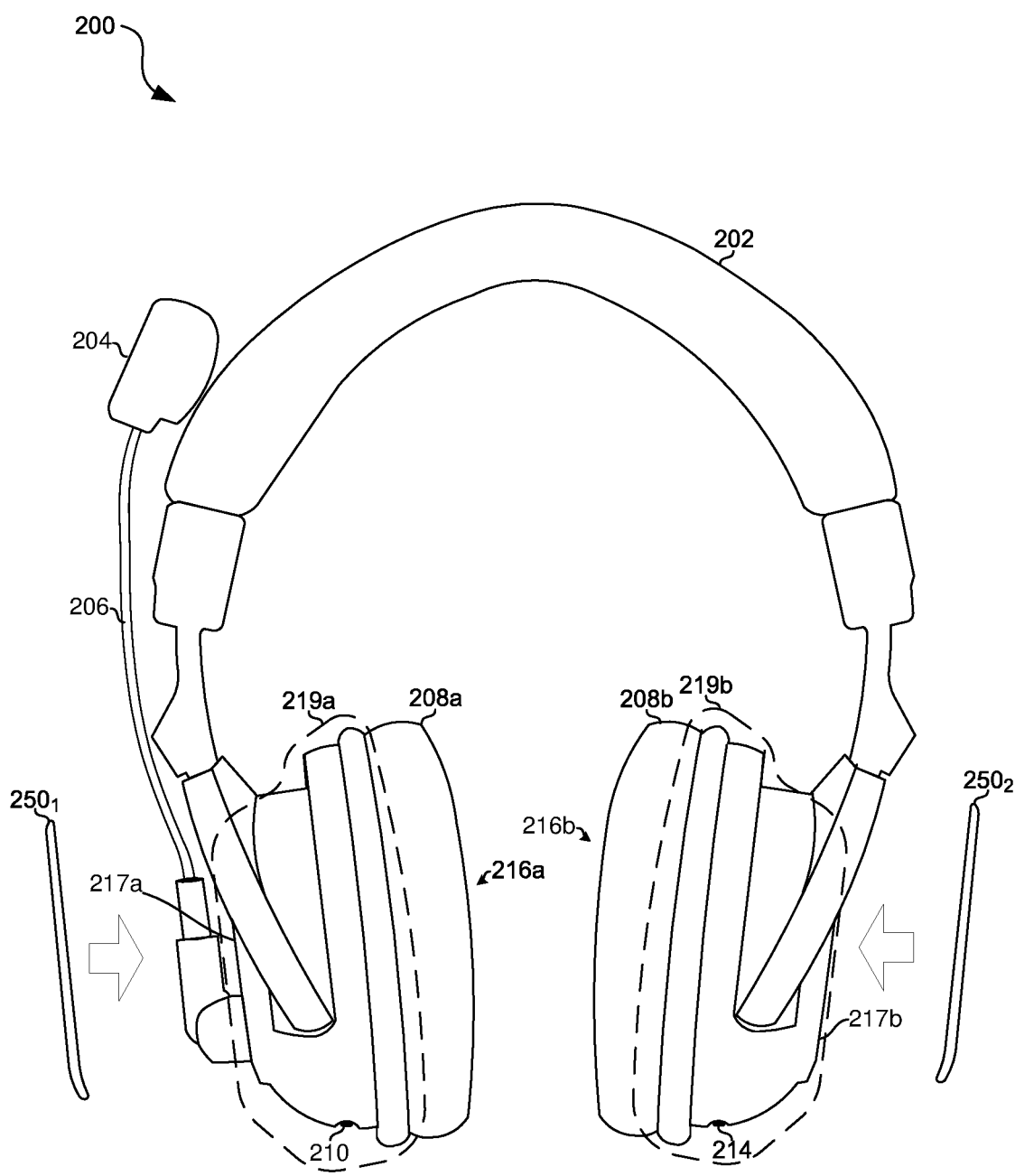
FIGS. 2A and 2B depict two views of an example embodiment of a gaming headset.
Figure 2B:
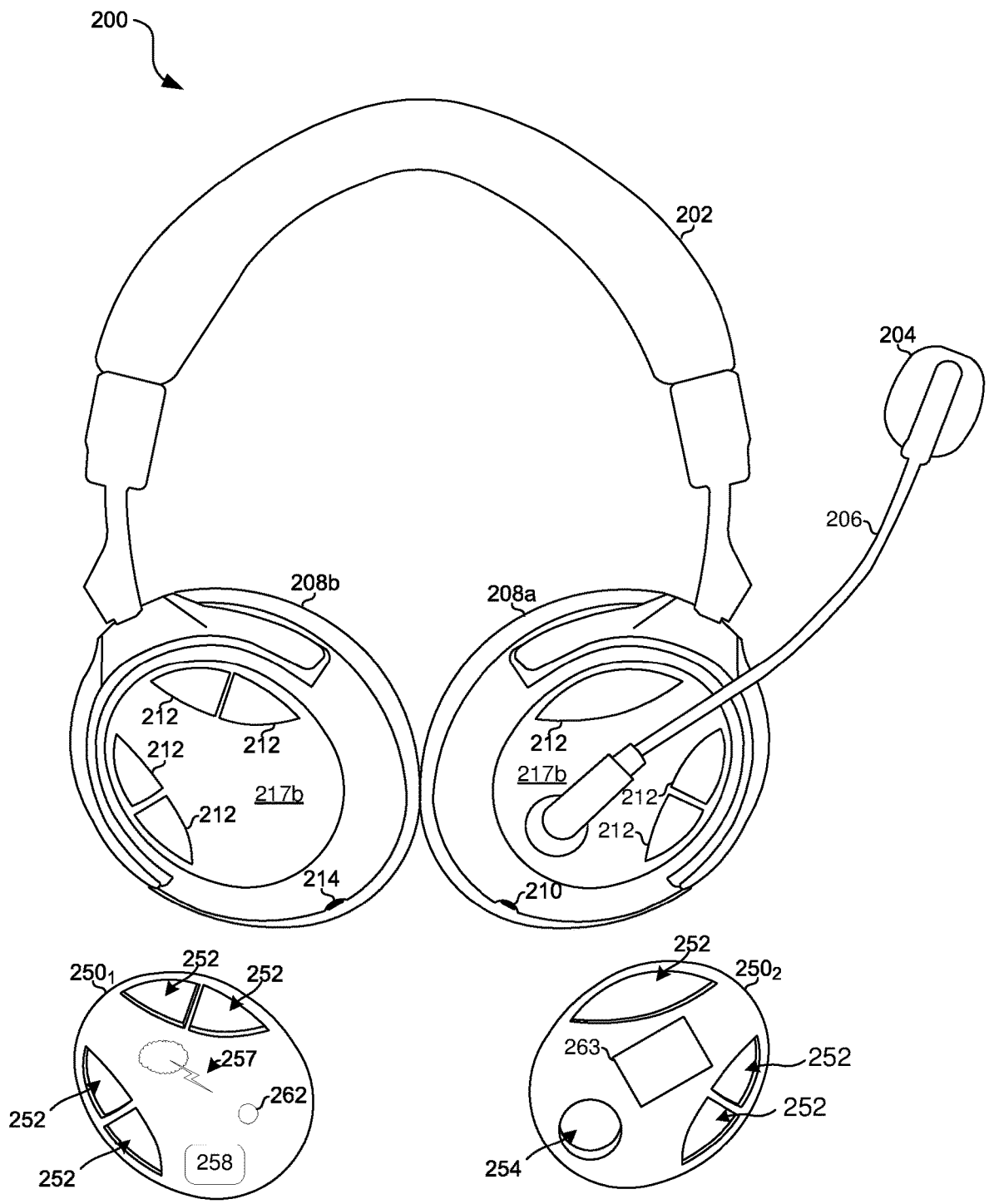

Referring to FIGS. 2A and 2B, there is shown two views of an example headset 200 that may present audio output by a gaming console such as the console 176. The headset 200 comprises a headband 202, a microphone boom 206 with microphone 204, speaker and circuitry housings 219a and 219b, ear cups 208a and 208b which attach to the housings 219b and 219b and surround speakers 216a and 216b, connector 210, connector 214, and user controls 212. Also shown in FIGS. 2A and 2B are headset accessories $250_1$ and $250_2$.

The connector 210 may be, for example, a 3.5 mm headphone socket for receiving analog audio signals (e.g., receiving chat audio via an Xbox "talkback" cable).

The microphone 204 converts acoustic waves (e.g., the voice of the person wearing the headset) to electric signals for processing by circuitry of the headset and/or for output to a device (e.g., console 176, basestation 300, a smartphone, and/or the like) that is in communication with the headset.

The speakers 216a and 216b convert electrical signals to soundwaves.

The user controls 212 may comprise dedicated and/or programmable buttons, switches, sliders, wheels, etc. for performing various functions. Example functions which the controls 212 may be configured to perform include: power the headset 200 on/off, mute/unmute the microphone 204, control gain/volume of, and/or effects applied to, chat audio by the audio processing circuitry of the headset 200, control gain/volume of, and/or effects applied to, game audio by the audio processing circuitry of the headset 200, enable/disable/initiate pairing (e.g., via Bluetooth, Wi-Fi direct, or the like) with another computing device, and/or the like.

The connector 214 may be, for example, a USB port. The connector 214 may be used for downloading data to the headset 200 from another computing device and/or uploading data from the headset 200 to another computing device. Such data may include, for example, parameter settings (described below). Additionally, or alternatively, the connector 214 may be used for communicating with another computing device such as a smartphone, tablet compute, laptop computer, or the like.

Each of the headset accessories $250_1$ and $250_2$ may be configured to attach to a respective one of the housings $219_1$ and $219_2$. Each of the headset accessories $250_1$ and $250_2$ may, for example, be made of molded plastic that attaches to a housing 219 by snapping to plastic of the housing 219. In an example implementation, a headset accessory 250 may be a thin disc having a shape substantially the same as a surface 217 of a housing 219 such that, when the accessory 250 is attached to the housing 219, the surface 217 of the housing 219 may be substantially covered by the accessory.

The example accessory $250_2$ depicted comprises a hole 254 to accommodate the microphone boom 206. Similarly, the example accessories $250_1$ and $250_2$ depicted have holes 252 to enable access to controls 212. In other example implementations, a headset accessory 250 may comprise controls that mechanically and/or electronically interface with the controls 212 and/or that electronically interface with the headset. As an example of a mechanical interface, a control of the accessory 250 may be a spring or rocker mechanism that transfers a pressing force to a corresponding one of controls 212. As an example of an electronic interface, in response to a press of a control 258 of the accessory 250, a signal may be sent to the headset via a wired and/or wireless link between circuitry of the accessory 250 and circuitry of the headset 200).

An electronic accessory 250 may comprise one or more light emitting diode (LED) 262 and/or one or more liquid crystal display (LCD). The state of the LED(s) 262 and/or LCD(s) 263 may be controlled based on signals received from the headset 200 during game play as, for example, described below with reference to FIG. 6.

An electronic accessory 250 may comprise a graphic 257 which may be associated with a particular video game and/or particular character of a particular game. In an example implementation, the graphic 257 may be associated with parameter settings stored in memory of the accessory 250. For example, the graphic 257 on accessory $250_1$ may be a picture of a particular super hero and parameter settings stored in memory of the accessory $250_1$ may be voice morph settings such that the headset 200 may morph the voice of its user to sound like the super hero while the accessory $250_1$ is attached to the headset 200. In an example implementation, the graphic (and/or color or some other visual characteristics of the accessory 250) may indicate a user associated with the accessory 250. For example, the graphic 257 may indicate whether the accessory $250_1$ is associated with an adult user or with a child user, where first parameter settings may be stored in the accessory $250_1$ if it is for use by an adult game player and second parameter settings may be stored in the accessory $250_1$ if it use by a child game player.

Figure 2C:
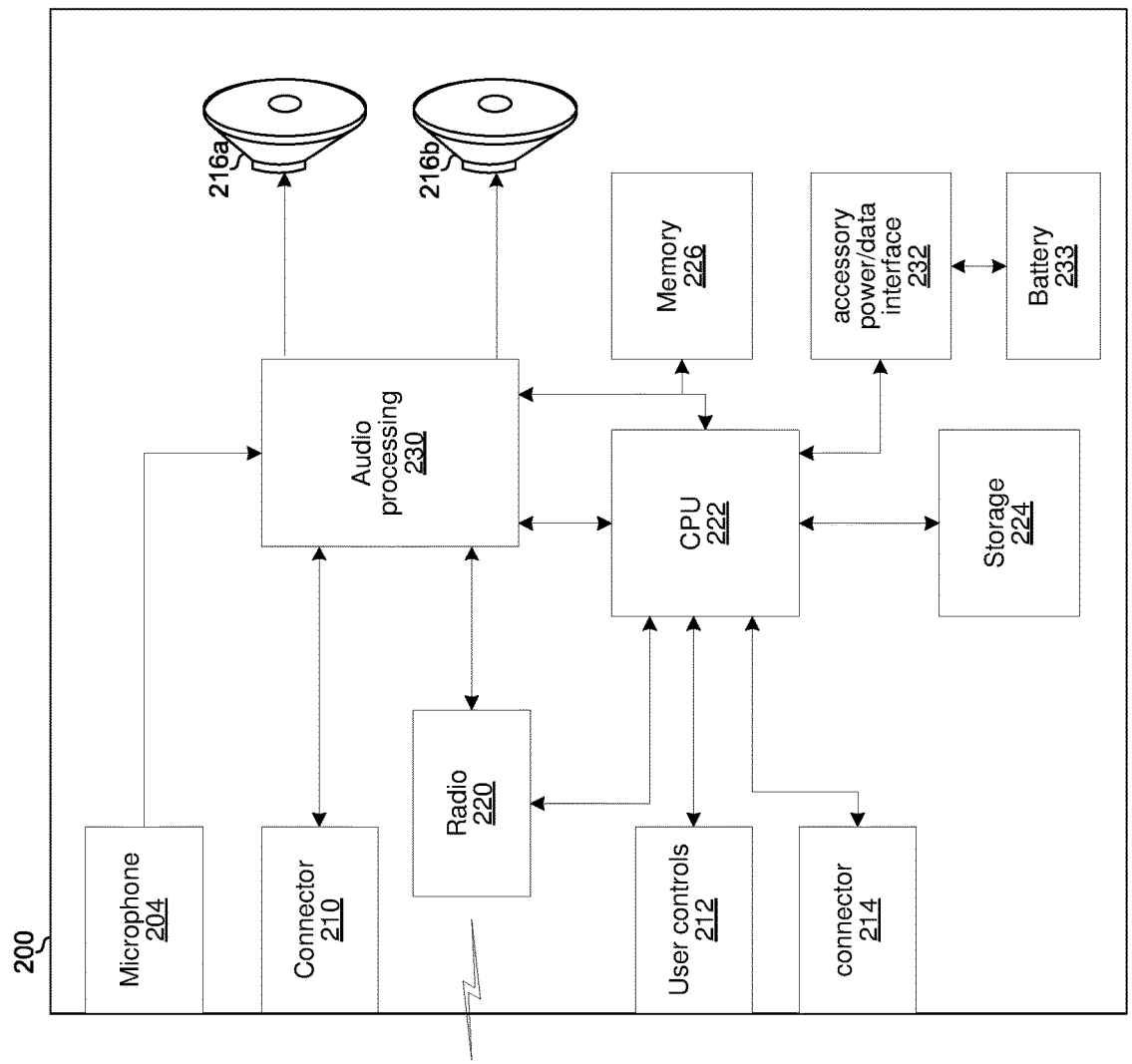
FIG. 2C depicts a block diagram of the example headset of FIGS. 2A and 2B.

FIG. 2C depicts a block diagram of the example headset 200. In addition to the connector 210, user controls 212, connector 214, microphone 204, and speakers 216a and 216b already discussed, shown are a radio 220, a CPU 222, a storage device 224, a memory 226, an audio processing circuit 230, and circuitry 232 for exchanging power and/or data with a headset accessory 250.

The radio 220 may comprise circuitry operable to communicate in accordance with one or more standardized (such as, for example, the IEEE 802.11 family of standards, the Bluetooth family of standards, and/or the like) and/or proprietary wireless protocol(s) (e.g., a proprietary protocol for receiving audio from an audio basestation such as the basestation 300).

The CPU 222 may comprise circuitry operable to execute instructions for controlling/coordinating the overall operation of the headset 200. Such instructions may be part of an operating system or state machine of the headset 200 and/or part of one or more software applications running on the headset 200. In some implementations, the CPU 222 may be, for example, a programmable interrupt controller, a state machine, or the like.

The storage device 224 may comprise, for example, FLASH or other nonvolatile memory for storing data which may be used by the CPU 222 and/or the audio processing circuitry 230. Such data may include, for example, parameter settings that affect processing of audio signals in the headset 200 and parameter settings that affect functions performed by the user controls 212. For example, one or more parameter settings may determine, at least in part, a gain of one or more gain elements of the audio processing circuitry 230. As another example, one or more parameter settings may determine, at least in part, a frequency response of one or more filters that operate on audio signals in the audio processing circuitry 230. As another example, one or more parameter settings may determine, at least in part, whether and which sound effects are added to audio signals in the audio processing circuitry 230 (e.g., which effects to add to microphone audio to morph the user's voice). Example parameter settings which affect audio processing are described in the co-pending U.S. patent application Ser. No. 13/040,144 titled "Gaming Headset with Programmable Audio" and published as US2012/0014553, the entirety of which is hereby incorporated herein by reference. Particular parameter settings may be selected autonomously by the headset 200 in accordance with one or more algorithms, based on user input (e.g., via controls 212), and/or based on input received via one or more of the connectors 210 and 214.

The memory 226 may comprise volatile memory used by the CPU 222 and/or audio processing circuit 230 as program memory, for storing runtime data, etc.

The audio processing circuit 230 may comprise circuitry operable to perform audio processing functions such as volume/gain control, compression, decompression, encoding, decoding, introduction of audio effects (e.g., echo, phasing, virtual surround effect, etc.), and/or the like. As described above, the processing performed by the audio processing circuit 230 may be determined, at least in part, by which parameter settings have been selected. The processing may be performed on game, chat, and/or microphone audio that is subsequently output to speaker 216a and 216b. Additionally, or alternatively, the processing may be performed on chat audio that is subsequently output to the connector 210 and/or radio 220.

The battery 233 may provide bias current and/or voltage to the circuitry of the headset 200 and/or to circuitry of an attached accessory 250 via interface 268. The battery 270 may be charged (i.e., receive bias current) via one or more of the connector 214, the connector 210, and the interface 268. Whether the battery is providing power to only the headset 200, providing power to both the headset 200 and an attached accessory 250, and/or is being charged via the interface 268 may be determined based on, for example, whether external power is currently available via one or more of connectors 214 and 210, relative charge levels of the battery 233 and a battery 270 of an attached accessory, and/or based on other considerations for efficient power management.

The circuitry 232 may be operable to provide bias voltage and/or bias current to an attached headset accessory 250 for powering circuitry of the attached accessory 250. The circuitry 232 may be operable to receive bias voltage and/or bias current from an attached headset accessory 250 for powering circuitry of the headset 200. The circuitry 232 may be operable to transmit and/or receive information signals to an attached headset accessory 250.

In an example implementation, the circuitry 232 may be operable to establish an inductive link to an attached headset accessory 250. In such an implementation, the circuitry 232 may comprise one or more coils or other inductive elements and positioned within the headset 200 such that, when a headset accessory 250 is attached, the circuitry 232 is in close proximity to corresponding circuitry of the accessory 250. Using an inductive link, bias current, bias voltage, and/or information signals may be conveyed between the headset 200 and accessory 250 across a plastic wall of the surface 217 of the headset 200. This may reduce the likelihood of an air leak (which may degrade sound quality) as compared to if a contact-based connector was used for the accessory 250.

Figure 2D:
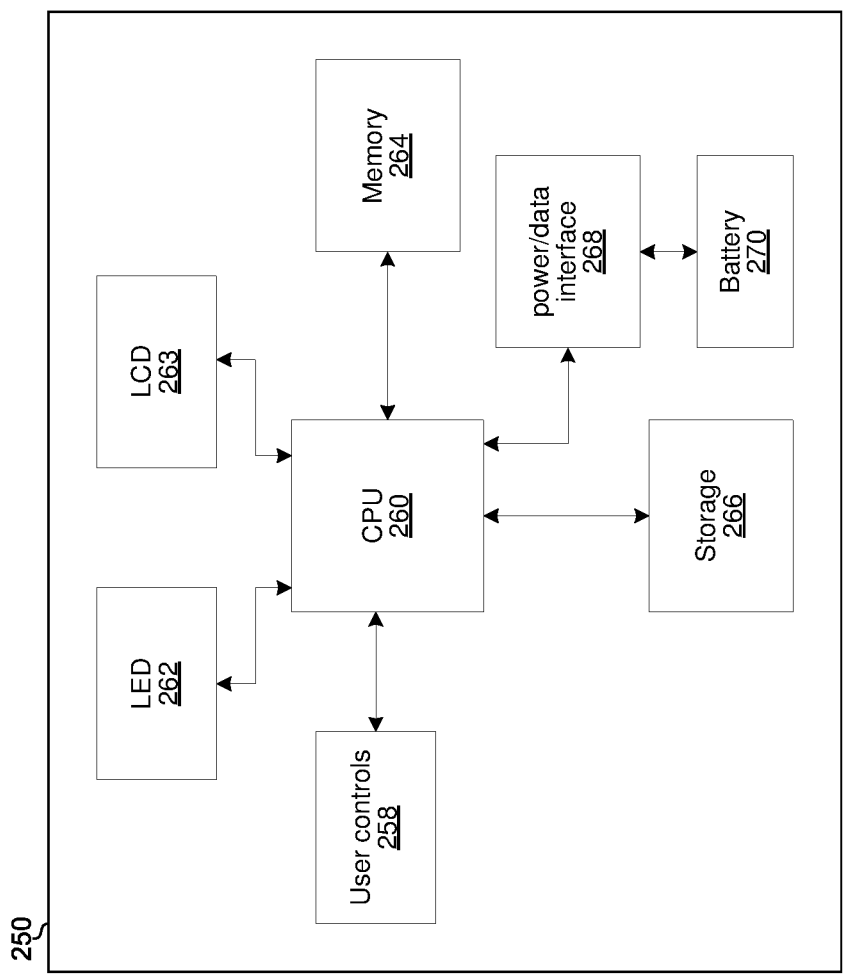
FIG. 2D depicts a block diagram of circuitry of an example headset.

FIG. 2D depicts a block diagram of circuitry of an example headset 200. The example accessory 250 comprises user controls 258, a CPU 260, an LED 262, an LCD 263, memory 264, storage 266, circuitry 268 for interfacing to a headset 200, and battery 270.

The user controls 258 may comprise dedicated and/or programmable buttons, switches, sliders, wheels, etc. for performing various functions. In response to a user interacting with the controls 258, a signal may be generated by the CPU 260 and sent to a headset 200 via interface 268. Example functions which the controls 258 may be configured to perform include any functions which may be performed by controls 212 of the headset 200, selection of parameter settings to be transferred from the accessory 250 to the headset 200, power the accessory 250 on/off, select between a manner in which a state of the LED 262 and/or LCD 263 is controlled, and/or the like.

The CPU 260 may comprise circuitry operable to execute instructions for controlling/coordinating the overall operation of the headset accessory 250. Such instructions may be part of an operating system or state machine of the headset 200 and/or part of one or more software applications running on the headset 200. In some implementations, the CPU 260 may be, for example, a programmable interrupt controller, a state machine, or the like.

The LED 262 may be operable to emit one or more colors when bias current is applied to it. A state of the LED 262 may correspond to whether it is on or off, and when on, may comprise the color being emitted by the LED 262. The CPU 260 may control the state of the LED 262 by, for example, controlling a bias current applied to one or more terminals of the LED 262. In an example implementation, the bias current for placing the LED 262 in the on state may be provided by a headset 200 via the interface 268.

The LCD 263 may comprise a plurality of pixels operable to display words and/or images (collectively "graphics"). A state of the LCD 263 may correspond to a graphic being displayed on the LCD 263. In an example implementation, pre-defined static bitmaps may be stored in storage 266 and the CPU 260 may select which bitmap is output to the LCD 263 based on, for example, information signals received via interface 268. In an example implementation, dynamic images that change in real-time in response to signals received via interface 268 may be displayed in the LCD 263 (e.g., a visualization of the frequency response of game, chat, and/or microphone audio).

The storage device 266 may comprise, for example, FLASH or other nonvolatile memory for storing data which may be used by the CPU 260 and/or by circuitry (e.g., the audio processing circuitry 230) of a headset 200. Such data may include, for example, parameter settings that may be transferred to a headset 200 to affect processing of audio signals in the headset 200 and to affect functions performed by the user controls 212 of the headset 200. Additionally, or alternatively, such data may include, for example, parameter settings that may affect how a state of the LED 262 and/or LCD 263 is controlled.

The memory 226 may comprise volatile memory used by the CPU 260 and/or interface 268 as program memory, storing runtime data, buffering data received via interface 268, buffering data to be sent via interface 268, etc.

The battery 270 may provide bias current and/or voltage to the circuitry of the accessory 250 and/or to circuitry of a headset 200 via interface 268. Additionally, or alternatively, the battery 270 may be charged (i.e., receive bias current) via the interface 268. Whether the battery is providing power to only the accessory 250, providing power to only a headset 200, providing power to both the accessory 250 and headset 200, and/or being charged via the interface 268 may be determined by, for example, relative charge levels of the battery 270 and the battery 233.

Figure 3A:
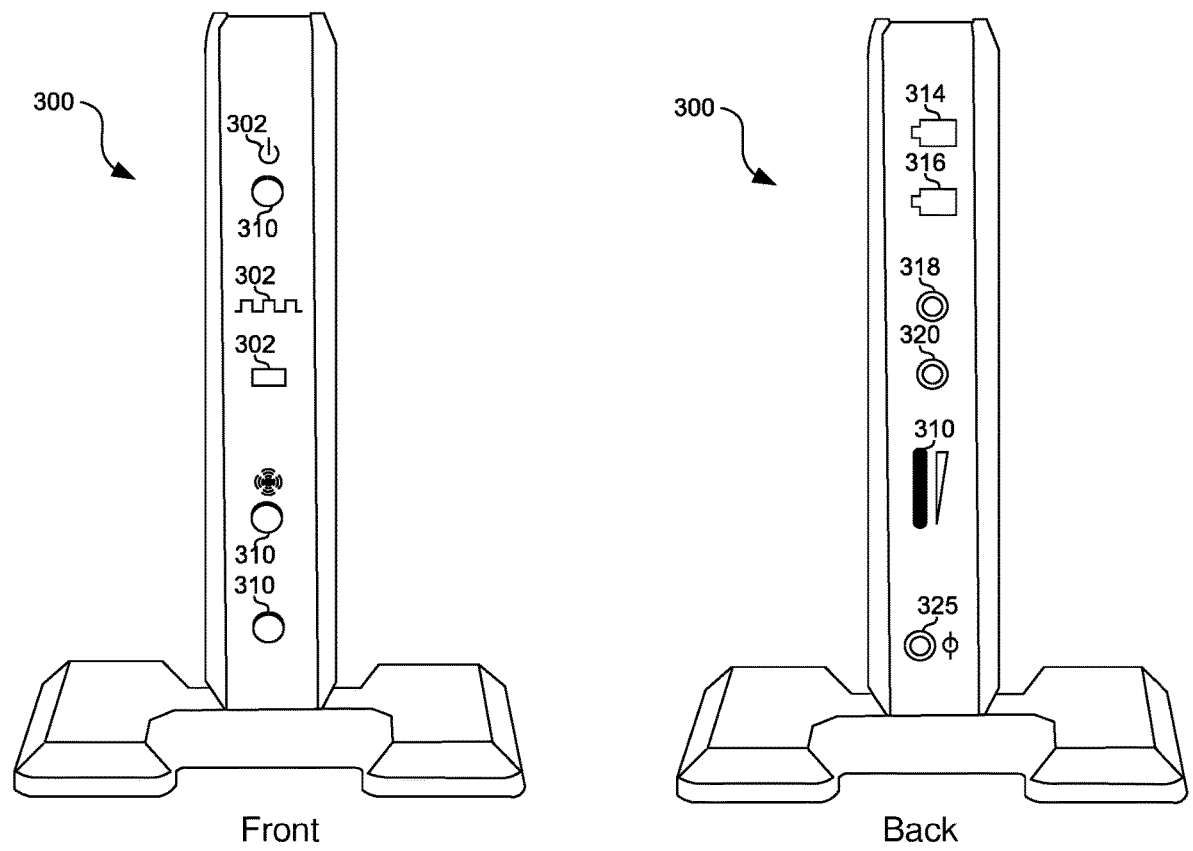
FIG. 3A depicts two views of an example embodiment of an audio basestation.

FIG. 3A depicts two views of an example embodiment of the audio basestation 300. The basestation 300 comprises status indicators 302, user controls 310, power port 325, and audio connectors 314, 316, 318, and 320.

The audio connectors 314 and 316 may comprise digital audio in and digital audio out (e.g., S/PDIF) connectors, respectively. The audio connectors 318 and 320 may comprise a left "line in" and a right "line in" connector, respectively. The controls 310 may comprise, for example, a power button, a button for enabling/disabling virtual surround sound, a button for adjusting the perceived angles of the speakers when the virtual surround sound is enabled, and a dial for controlling a volume/gain of the audio received via the "line in" connectors 318 and 320. The status indicators 302 may indicate, for example, whether the audio basestation 300 is powered on, whether audio data is being received by the basestation 300 via connectors 314, and/or what type of audio data (e.g., Dolby Digital) is being received by the basestation 300.

Figure 3B:
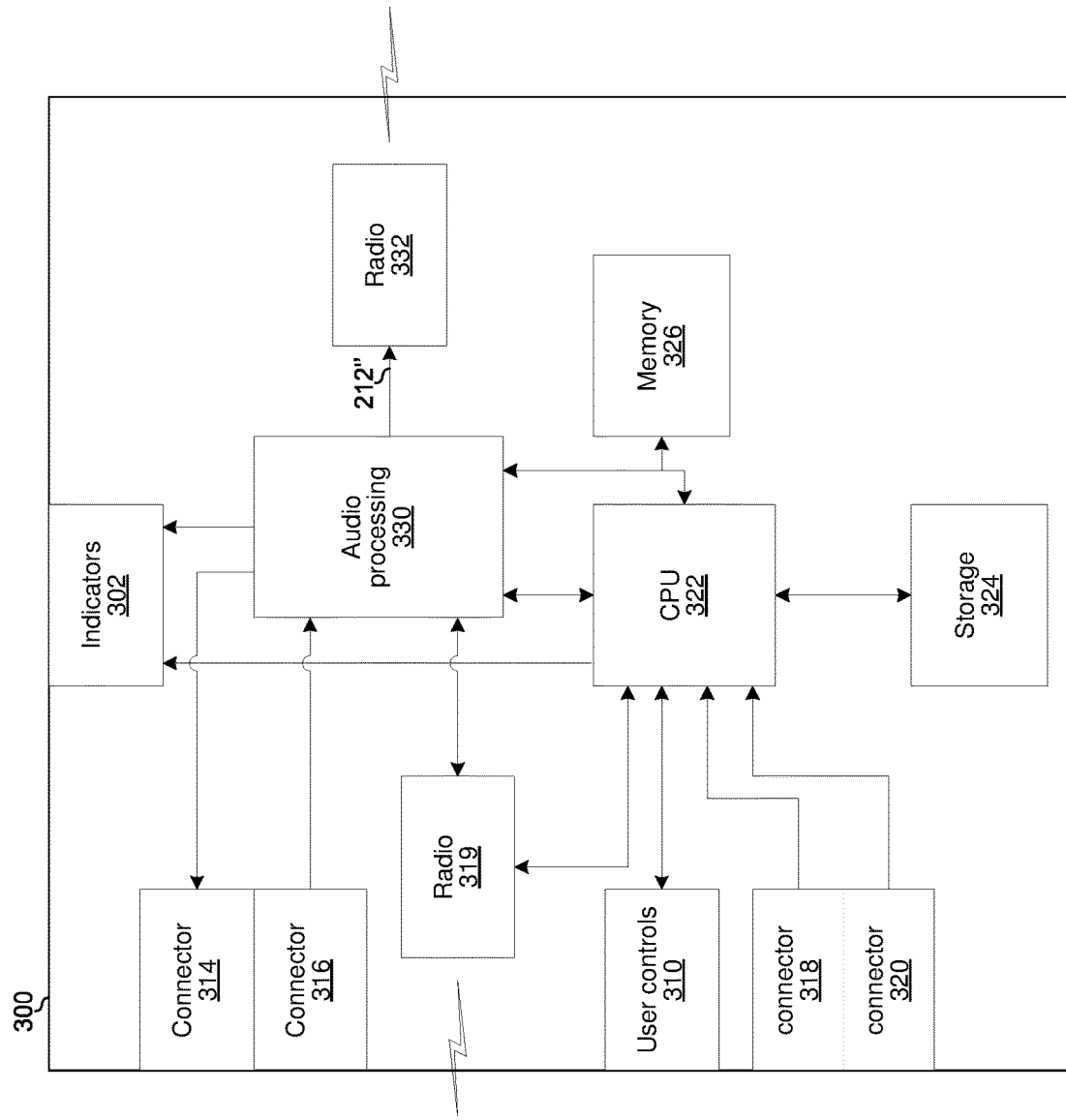
FIG. 3B depicts a block diagram of the example audio basestation of FIG. 3A.

FIG. 3B depicts a block diagram of the audio basestation 300. In addition to the user controls 310, indicators 302, and connectors 314, 316, 318, and 320 described above, the block diagram additionally shows a CPU 322, a storage device 324, a memory 326, a radio 319, an audio processing circuit 330, and a radio 332.

The radio 319 comprises circuitry operable to communicate in accordance with one or more standardized (such as the IEEE 802.11 family of standards, the Bluetooth family of standards, and/or the like) and/or proprietary (e.g., proprietary protocol for receiving audio protocols for receiving audio from a console such as the console 176) wireless protocols.

The radio 332 comprises circuitry operable to communicate in accordance with one or more standardized (such as, for example, the IEEE 802.11 family of standards, the Bluetooth family of standards, and/or the like) and/or proprietary wireless protocol(s) (e.g., a proprietary protocol for transmitting audio to headphones 200).

The CPU 322 comprises circuitry operable to execute instructions for controlling/coordinating the overall operation of the audio basestation 300. Such instructions may be part of an operating system or state machine of the audio basestation 300 and/or part of one or more software applications running on the audio basestation 300. In some implementations, the CPU 322 may be, for example, a programmable interrupt controller, a state machine, or the like.

The storage 324 may comprise, for example, FLASH or other nonvolatile memory for storing data which may be used by the CPU 322 and/or the audio processing circuitry 330. Such data may include, for example, parameter settings that affect processing of audio signals in the basestation 300. For example, one or more parameter settings may determine, at least in part, a gain of one or gain elements of the audio processing circuitry 330. As another example, one or more parameter settings may determine, at least in part, a frequency response of one or more filters that operate on audio signals in the audio processing circuitry 330. As another example, one or more parameter settings may determine, at least in part, whether and which sound effects are added to audio signals in the audio processing circuitry 330 (e.g., which effects to add to microphone audio to morph the user's voice). Example parameter settings which affect audio processing are described in the co-pending U.S. patent application Ser. No. 13/040,144 titled "Gaming Headset with Programmable Audio" and published as US2012/0014553, the entirety of which is hereby incorporated herein by reference. Particular parameter settings may be selected autonomously by the basestation 300 in accordance with one or more algorithms, based on user input (e.g., via controls 310), and/or based on input received via one or more of the connectors 314, 316, 318, and 320.

The memory 326 may comprise volatile memory used by the CPU 322 and/or audio processing circuit 330 as program memory, for storing runtime data, etc.

The audio processing circuit 330 may comprise circuitry operable to perform audio processing functions such as volume/gain control, compression, decompression, encoding, decoding, introduction of audio effects (e.g., echo, phasing, virtual surround effect, etc.), and/or the like. As described above, the processing performed by the audio processing circuit 330 may be determined, at least in part, by which parameter settings have been selected. The processing may be performed on game and/or chat audio signals that are subsequently output to a device (e.g., headset 200) in communication with the basestation 300. Additionally, or alternatively, the processing may be performed on a microphone audio signal that is subsequently output to a device (e.g., console 176) in communication with the basestation 300.

Figure 4:
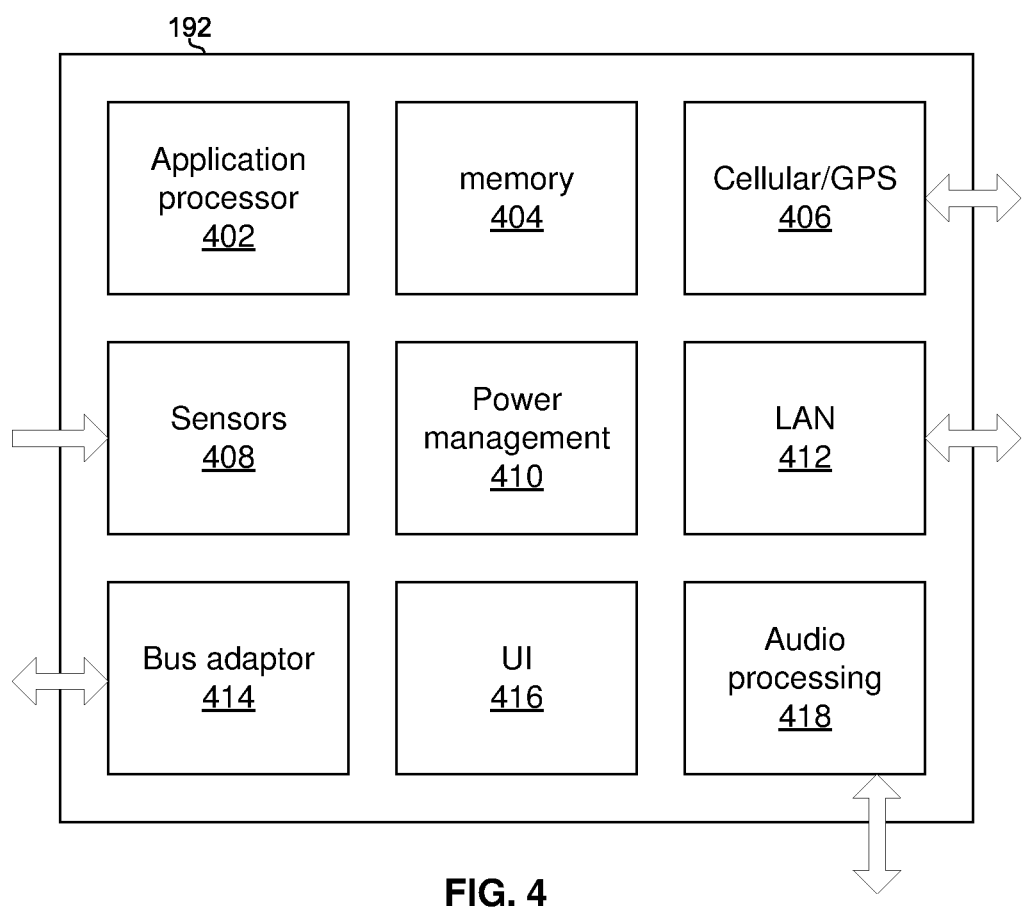
FIG. 4 depicts a block diagram of an example multi-purpose device.

FIG. 4 depicts a block diagram of an example multi-purpose device 192. The example multi-purpose device 192 comprises a an application processor 402, memory subsystem 404, a cellular/GPS networking subsystem 406, sensors 408, power management subsystem 410, LAN subsystem 412, bus adaptor 414, user interface subsystem 416, and audio processor 418.

The application processor 402 comprises circuitry operable to execute instructions for controlling/coordinating the overall operation of the multi-purpose device 192 as well as graphics processing functions of the multi-purpose device 402. Such instructions may be part of an operating system of the device 192 and/or part of one or more software applications running on the device 192.

The memory subsystem 404 comprises volatile memory for storing runtime data, nonvolatile memory for mass storage and long-term storage, and/or a memory controller which controls reads writes to memory.

The cellular/GPS networking subsystem 406 comprises circuitry operable to perform baseband processing and analog/RF processing for transmission and reception of cellular and GPS signals.

The sensors 408 comprise, for example, a camera, a gyroscope, an accelerometer, a biometric sensor, and/or the like.

The power management subsystem 410 comprises circuitry operable to manage distribution of power among the various components of the multi-purpose device 192.

The LAN subsystem 412 comprises circuitry operable to perform baseband processing and analog/RF processing for transmission and reception of wired, optical, and/or wireless signals (e.g., in accordance with Wi-Fi, Wi-Fi Direct, Bluetooth, Ethernet, and/or other standards).

The bus adaptor 414 comprises circuitry for interfacing one or more internal data busses of the multi-purpose device with an external bus (e.g., a Universal Serial Bus) for transferring data to/from the multi-purpose device via a wired connection.

The user interface subsystem 416 comprises circuitry operable to control and relay signals to/from a touchscreen, hard buttons, and/or other input devices of the multi-purpose device 192.

The audio processor 418 comprises circuitry to process (e.g., digital to analog conversion, analog-to-digital conversion, compression, decompression, encryption, decryption, resampling, etc.) audio signals. The audio processor 418 may be operable to receive and/or output signals via a connector such as a 3.5 mm stereo and microphone connector.

Figure 5:
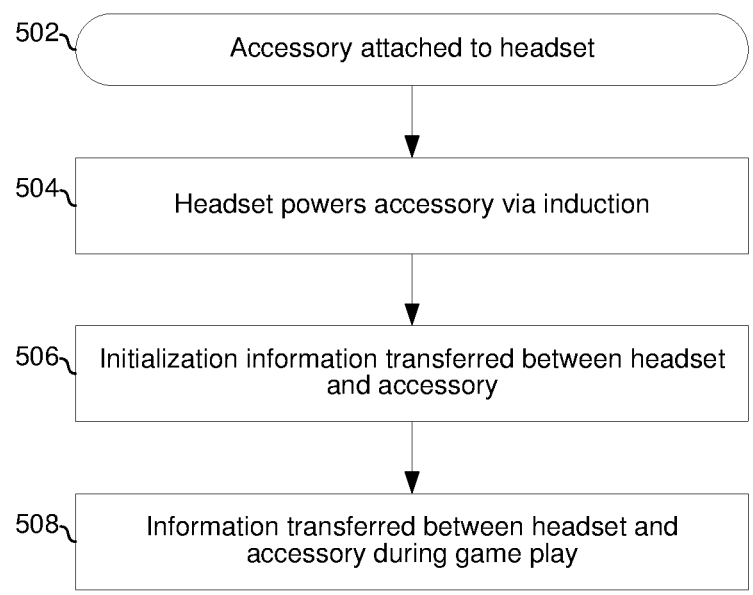
FIG. 5 is a flowchart illustrating example interactions between an audio headset and a headset accessory.

FIG. 5 is a flowchart illustrating example interactions between an audio headset and a headset accessory. The example flowchart begins with block 502*n* which a headset accessory 250 is attached to a headset 200.

In block 504, the headset 200 applies a bias current and/or voltage to the accessory 250 via interface 268, and the circuitry of the accessory 250 powers up upon receiving the bias current and/or voltage.

In block 506, initialization information is transferred between the headset 200 and the accessory 250 via the interface 268. The initialization information may include, for example, parameter settings such as those described above, information about a game being played (i.e., the game whose audio is being conveyed to the headset 200 by console 176) or a state of the game (e.g., a current level or scenario ongoing in the game, the player/headset wearer's character in the game, and/or the like), information about a player/wearer of the headset 200 (e.g., age, gaming skill level, gaming preferences, etc.), and/or information such as may be stored in a data structure such as the database 182.

In block 508, game play begins and a state of the LED 262 and/or LCD 263 is controlled based on information conveyed via the interface 268 during game play. Such information may include, for example, characteristics (e.g., intensity, tone, pitch, peak to average power ratio, and/or any other time-domain and/or frequency-domain characteristic) of game, chat, and/or microphone audio currently being processed in the headset 200, information about a state of the game, and/or the like.

In an example implementation, the storage 266 of the accessory 250 may store parameter settings for a particular game and may store a record 183 for the particular game. The record may include signatures for each of one or more sounds of the particular game and information to be sent over the interface 268 in response to detection of a corresponding one of the sounds. In such an implementation, block 506 may comprise the parameter settings and record 183 being automatically transferred to the headset 200 and loaded into the audio processor 230 upon the accessory 250 powering up. In this example implementation, block 508 may comprise the audio processing circuitry 230 monitoring for the sounds in the transferred record 183 and, upon detecting such sounds, sending the corresponding information over the interface 268. The accessory 250 may then control a state of the LED 262 (e.g., turn the LED on, off, or change its color) and/or LCD 263 (e.g., update an image displayed no the LCD 263) based on the received information.

In an example implementation of this disclosure, a headset accessory (e.g., 250) comprises circuitry (e.g., 258, 260, 262, 263, 264, 266, 268, and/or 270) is configured to mechanically attach to an audio headset (e.g., 200). The circuitry of the headset may be operable to establish a link to the audio headset that supports conveyance of bias voltage, bias current, and/or information between the circuitry of the accessory and circuitry of the audio headset. The headset accessory may be substantially disc shaped. The audio headset may comprise a speaker and circuitry housing (e.g., 219) with an ear cup mounted to a first side of the speaker and circuitry housing. The headset accessory may be configured to attach to the housing such that, when attached, it is on and/or covers a surface (e.g., 217) of the speaker and circuitry housing that is opposite the first side. A state of the circuitry (e.g., on/off state of LED 262 and/or LCD 263, and/or a graphic displayed on LCD 263) may be controlled based on the information received from the audio headset via the link. The information may include characteristics of audio being processed by the audio headset. The state of the circuitry of the headset accessory may be controlled based on the characteristics of the audio. The circuitry of the headset accessory may comprise non-volatile memory (e.g., 266), and the non-volatile memory may store parameter settings for configuring audio processing circuitry of the audio headset. The parameter settings stored in the non-volatile memory of the headset accessory may be associated with a particular video game. The parameter settings stored in the non-volatile memory of the headset accessory may be associated with a particular game player such that, for example, a headset 200 may be customized to a particular player's preferences, abilities, age, and/or the link simply by attaching the particular players' headset accessory. The circuitry of the headset accessory may comprise a battery. The circuitry may be configurable to operate in a first mode in which the battery is charged by the bias current. The circuitry may be configurable to operate in a second mode in which the battery provides the bias current and/or bias voltage. The link between the accessory and the headset may be an inductive link. Information conveyed via the link between the headset and the headset accessory may comprise an identification of which game is being played. Interactions between the accessory and the headset may be controlled based on the identification of the game being played (e.g., which parameter settings are transferred from the accessory to the headset may be determined based on which game is being played). A state of the circuitry of the accessory may be controlled based on the game being played (e.g., a first graphic may be displayed on the LCD 263 for a first game and a second graphic may be displayed for a second game).

The present method and/or system may be realized in hardware, software, or a combination of hardware and software. The present methods and/or systems may be realized in a centralized fashion in at least one computing system, or in a distributed fashion where different elements are spread across several interconnected computing systems. Any kind of computing system or other apparatus adapted for carrying out the methods described herein is suited. A typical combination of hardware and software may be a general-purpose computing system with a program or other code that, when being loaded and executed, controls the computing system such that it carries out the methods described herein. Another typical implementation may comprise an application specific integrated circuit or chip. Some implementations may comprise a non-transitory machine-readable (e.g., computer readable) medium (e.g., FLASH drive, optical disk, magnetic storage disk, or the like) having stored thereon one or more lines of code executable by a machine, thereby causing the machine to perform processes as described herein.

While the present method and/or system has been described with reference to certain implementations, it will be understood by those skilled in the art that various changes may be made and equivalents may be substituted without departing from the scope of the present method and/or system. In addition, many modifications may be made to adapt a particular situation or material to the teachings of the present disclosure without departing from its scope. Therefore, it is intended that the present method and/or system not be limited to the particular implementations disclosed, but that the present method and/or system will include all implementations falling within the scope of the appended claims.

What is claimed is:

1. A system comprising:
   a headset accessory that comprises circuitry, wherein:
      said headset accessory is configured to mechanically attach to an audio headset comprising speakers and a microphone;
      said audio headset is operably customized to a skill level and/or an age of a user by attaching said headset accessory to said audio headset;
      said circuitry of said headset accessory is operable to establish a wireless inductive link to said audio headset, wherein said wireless inductive link supports conveyance of gaming information between said circuitry and said audio headset;
      said circuitry alters, based on said gaming information, a voice of the user received from said microphone of said audio headset to sound like a different person or game character; and
      said circuitry of said headset accessory causes display of a characteristic of a user of the headset.

2. The system of claim 1, wherein said headset accessory is disc shaped.

3. The system of claim 2, wherein:
   said audio headset comprises a speaker and circuitry housing with an ear cup mounted to a first side of said speaker and circuitry housing;
   said headset accessory is configured to attach to said housing such that, when attached, said headset accessory covers a surface of said speaker and circuitry housing that is opposite said first side of said speaker and circuitry housing.

4. The system of claim 1, wherein a state of said circuitry is controlled based on said gaming information received from said audio headset via said link.

5. The system of claim 4, wherein said circuitry comprises one or more light emitting diodes.

6. The system of claim 5 wherein said state of said circuitry comprises an on/off state and/or color of said one or more light emitting diodes.

7. The system of claim 4, wherein said circuitry comprises a liquid crystal display (LCD).

8. The system of claim 7, wherein said characteristic of said user of the headset is displayed on said LCD and comprises an age level of said user.

9. The system of claim 1, wherein said gaming information comprises characteristics of audio being processed by said audio headset.

10. The system of claim 9, wherein a state of said circuitry is controlled based on said characteristics of said audio.

11. The system of claim 1, wherein:
    said circuitry comprises non-volatile memory; and
    said non-volatile memory stores parameter settings for configuring audio processing circuitry of said audio headset.

12. The system of claim 11, wherein said parameter settings stored in said non-volatile memory of said headset accessory are associated with a particular video game.

13. The system of claim 11, wherein said parameter settings stored in said non-volatile memory of said headset accessory are associated with a particular game player.

14. The system of claim 1, wherein:
    said circuitry comprises a battery;
    said circuitry is configurable to operate in a first mode in which said battery is charged by a bias current; and
    said circuitry is configurable to operate in a second mode in which said battery provides said bias current and/or bias voltage.

15. The system of claim 1, wherein said wireless inductive link communicates bias current, bias voltage, and/or information signals to said audio headset.

16. The system of claim 1, wherein said gaming information comprises an identification of which game is being played.

17. The system of claim 1, wherein interactions between said headset accessory and said headset are controlled based on said game being played.

18. A method comprising:
    performing by circuitry in a headset accessory that is configured to mechanically attach to an audio headset on a surface of said audio headset that is opposite an ear cup of said audio headset, said audio headset comprising speakers and a microphone:
       upon attachment to said audio headset, establishing a wireless inductive link to said audio headset;
       upon attachment to said audio headset, customizing said audio headset to a skill level and/or an age of a user;
       upon establishing said wireless inductive link to said audio headset, using said wireless inductive link for conveyance of gaming information;
       altering, based on said gaming information, a voice of a user received from said microphone of said audio headset to sound like a different person or game character; and
       causing display of a characteristic of a user of the headset on a display.

19. The method of claim 18, wherein said gaming information comprises characteristics of audio being processed by said audio headset and said method comprises controlling a state of said circuitry based on said characteristics of said audio.

20. The method of claim 18, wherein:
    said circuitry comprises non-volatile memory;

said non-volatile memory stores parameter settings for configuring audio processing circuitry of said audio headset; and said information includes said parameter settings from said headset accessory to said audio headset.

\* \* \* \* \*